US009269456B2

(12) United States Patent
Mori et al.

(10) Patent No.: US 9,269,456 B2
(45) Date of Patent: Feb. 23, 2016

(54) SEMICONDUCTOR MEMORY TEST METHOD AND SEMICONDUCTOR MEMORY

(71) Applicant: FUJITSU SEMICONDUCTOR LIMITED, Yokohama, Kanagawa (JP)

(72) Inventors: Kaoru Mori, Akishima (JP); Yoshimasa Yagishita, Hino (JP); Hajime Aoki, Tama (JP)

(73) Assignee: Socionext Inc., Yokohama (JP)

( * ) Notice: Subject to any disclaimer, the term of this patent is extended or adjusted under 35 U.S.C. 154(b) by 369 days.

(21) Appl. No.: 13/680,913

(22) Filed: Nov. 19, 2012

(65) Prior Publication Data
US 2013/0170308 A1 Jul. 4, 2013

(30) Foreign Application Priority Data

Dec. 28, 2011 (JP) .................................. 2011-287935

(51) Int. Cl.
| | | |
|---|---|---|
| G11C 29/10 | (2006.01) | |
| G11C 16/16 | (2006.01) | |
| G11C 16/34 | (2006.01) | |
| G11C 29/02 | (2006.01) | |
| G11C 29/00 | (2006.01) | |
| G11C 16/00 | (2006.01) | |

(52) U.S. Cl.
CPC .............. *G11C 29/00* (2013.01); *G11C 29/021* (2013.01); *G11C 29/028* (2013.01); *G11C 16/00* (2013.01); *G11C 16/16* (2013.01); *G11C 16/3445* (2013.01); *G11C 29/10* (2013.01)

(58) Field of Classification Search
CPC ...... G11C 29/00; G11C 29/04; G11C 29/028; G11C 29/021; G11C 16/3445; G11C 29/10; G11C 16/16; G11C 16/00

USPC ...................................... 365/201, 185.29, 200
See application file for complete search history.

(56) References Cited

U.S. PATENT DOCUMENTS

| | | | | |
|---|---|---|---|---|
| 5,539,699 A | * | 7/1996 | Sato et al. ...................... | 365/201 |
| 6,301,159 B1 | * | 10/2001 | Pan .............................. | 365/185.3 |
| 6,549,467 B2 | * | 4/2003 | Roohparvar .............. | 365/185.33 |
| 6,665,214 B1 | * | 12/2003 | Cheah et al. .............. | 365/185.22 |

(Continued)

FOREIGN PATENT DOCUMENTS

| | | |
|---|---|---|
| CN | 101916593 A | 12/2010 |
| JP | 08-031189 A | 2/1996 |
| JP | 2000-207897 A | 7/2000 |

(Continued)

OTHER PUBLICATIONS

Chinese Office Action mailed Mar. 24, 2015 for corresponding Chinese Patent Application No. 201210530440.9.

(Continued)

*Primary Examiner* — J. H. Hur
(74) *Attorney, Agent, or Firm* — Arent Fox LLP

(57) ABSTRACT

A first erase test is performed by applying an erase pulse to series of memory cells which are included in a memory cell array and which are divided into a plurality of groups until the appearance of a group for which the determination that erase is completed is made. A second erase test is performed on other series of memory cells including the series of memory cells on the basis of the number of erase pulses at the time of detecting a group for which the determination that erase is completed is made first.

8 Claims, 15 Drawing Sheets

(56) References Cited

U.S. PATENT DOCUMENTS

| | | | |
|---|---|---|---|
| 7,009,889 B2 * | 3/2006 | Tran et al. | 365/185.29 |
| 7,415,646 B1 * | 8/2008 | Lee et al. | 714/733 |

FOREIGN PATENT DOCUMENTS

| | | | |
|---|---|---|---|
| JP | 2001-273792 A | 10/2001 | |
| JP | 2005-506653 A | 3/2005 | |
| WO | WO 03/036650 A2 | 5/2003 | |

OTHER PUBLICATIONS

Chinese Office Action issued Oct. 28, 2015 for corresponding Chinese Application No. 201210530440.9.

* cited by examiner

SEMICONDUCTOR MEMORY TEST METHOD AND SEMICONDUCTOR MEMORY

CROSS-REFERENCE TO RELATED APPLICATION

This application is based upon and claims the benefit of priority of the prior Japanese Patent Application No. 2011-287935, filed on Dec. 28, 2011, the entire contents of which are incorporated herein by reference.

FIELD

The embodiments discussed herein are related to a semiconductor memory test method and a semiconductor memory.

BACKGROUND

The following sampling erase test is proposed as a semiconductor memory erase test. In this sampling erase test, the number of erase pulses by which erase is completed for a part of memory cells in a memory cell array is found and erase is performed in a remaining area on the basis of the number of erase pulses.

The following erase test method is proposed as an EEPROM (Electrically Erasable Programmable Read-Only Memory) erase test method. In this erase test method, an erase test is repeated in a part of a storage area until the determination that erase is performed normally is made, the width of an erase pulse is set on the basis of the number of repetitions, and an erase test is performed in a remaining large part of the storage area by the use of the pulse width.

Japanese Laid-open Patent Publication No. 08-31189
Japanese Laid-open Patent Publication No. 2000-207897
Japanese Laid-open Patent Publication No. 2001-273792

It is assumed that the number or width of erase pulses obtained by performing an erase test in a part of a storage area is considered as a verification threshold at the time of performing verification in a remaining part of the storage area. If erase is completed for a memory cell before this verification threshold is reached, then the determination that the memory cell is normal is made.

There may be a memory cell in a part of a storage area which needs a long time for erase, compared with the other memory cells. In this case, the number or width of erase pulses obtained is influenced by the memory cell. As a result, a verification threshold becomes high and a verification standard is relaxed at the time of performing verification in a remaining part of the storage area. In this case, a memory cell which is originally bad cannot be detected and the reliability of a semiconductor memory decreases.

SUMMARY

According to an aspect, there is provided a semiconductor memory test method including performing a first erase test by applying an erase pulse to series of memory cells which are included in a memory cell array and which are divided into a plurality of groups until appearance of a group for which the determination that erase is completed is made and performing a second erase test on other series of memory cells including the series of memory cells on the basis of the number of erase pulses at the time of detecting a group for which the determination that erase is completed is made first.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
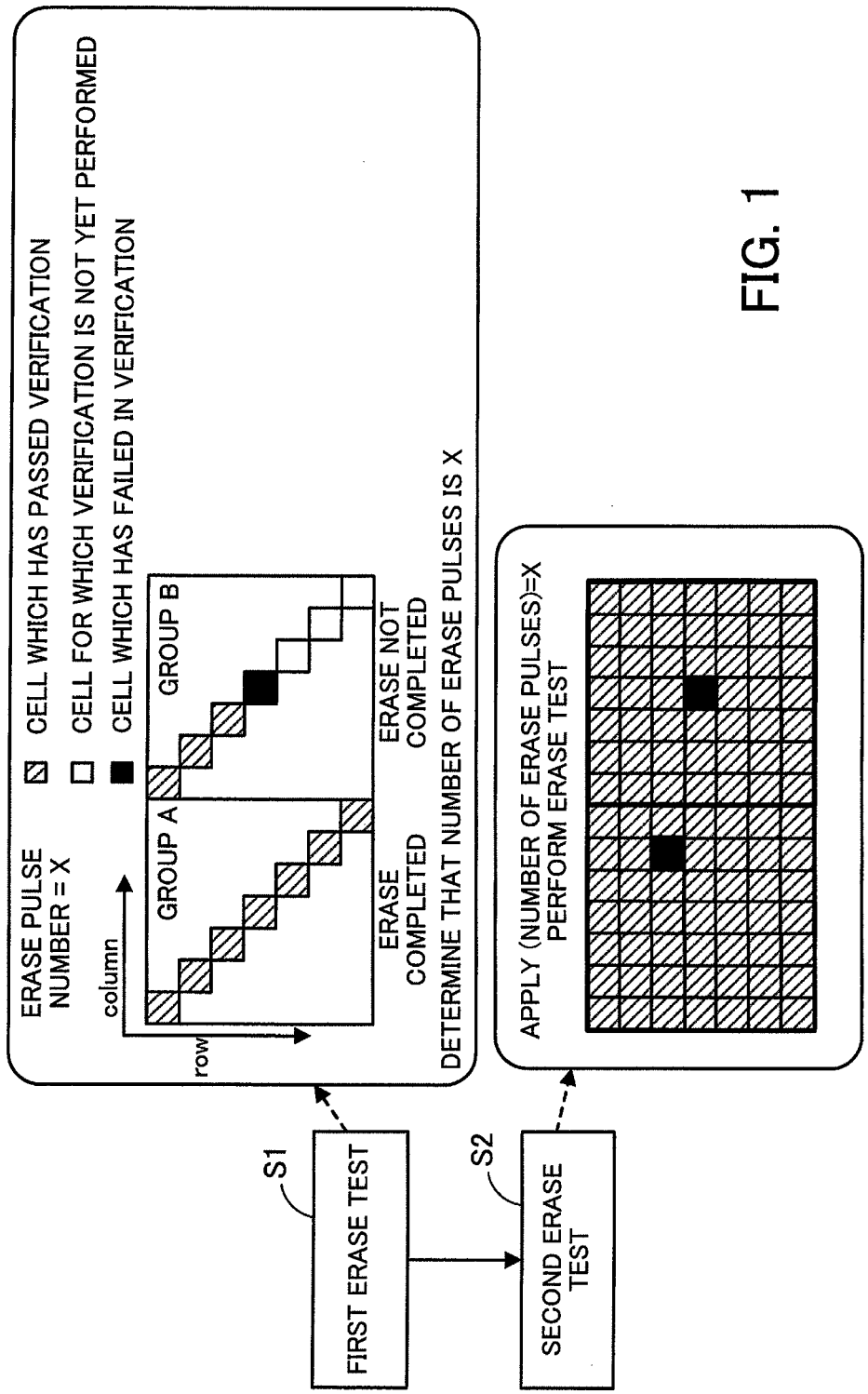
FIG. 1 is an example of a semiconductor memory test method according to a first embodiment.

Embodiments of a semiconductor memory test method and a semiconductor memory will now be described with reference to the accompanying drawings, wherein like reference numerals refer to like elements throughout.

First Embodiment

FIG. 1 is an example of a semiconductor memory test method according to a first embodiment.

Figure 2:
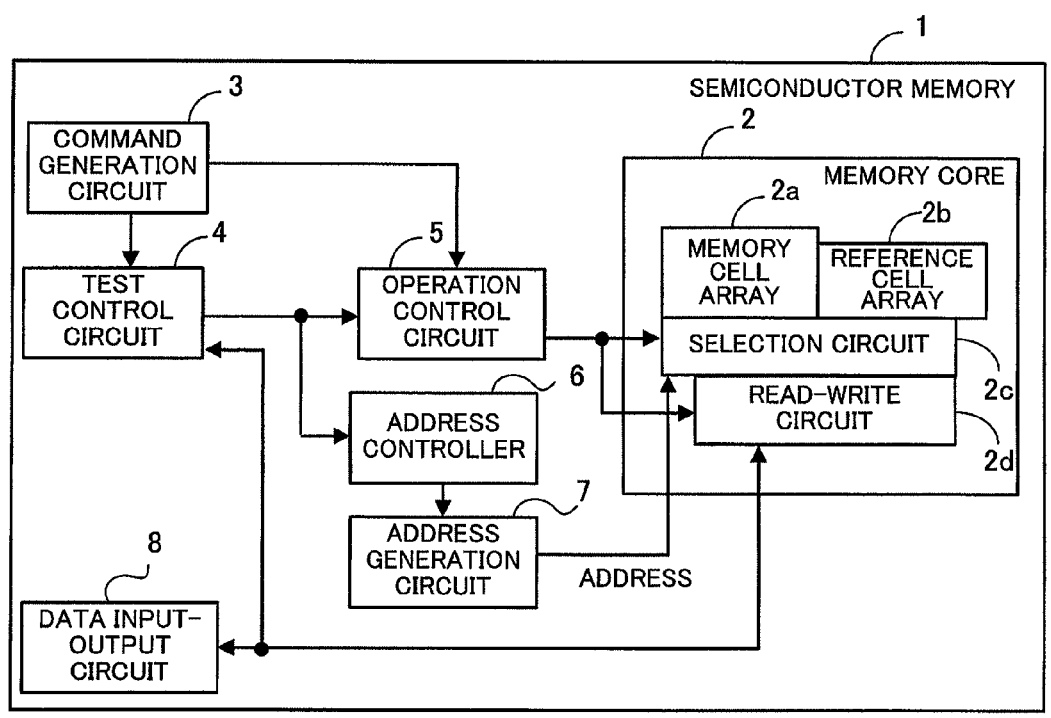
FIG. 2 is an example of a semiconductor memory according to a first embodiment.

Furthermore, FIG. 2 is an example of a semiconductor memory according to a first embodiment. FIG. 2 will be described first.

A semiconductor memory 1 is, for example, a nonvolatile memory, such as a flash memory, and includes a memory core 2, a command generation circuit 3, a test control circuit 4, an operation control circuit 5, an address controller 6, an address generation circuit 7, and a data input-output circuit 8.

The memory core 2 includes a memory cell array 2a, a reference cell array 2b, a selection circuit 2c, and a read-write circuit 2d.

A plurality of memory cells are arranged like a matrix in the memory cell array 2a. The reference cell array 2b includes a reference cell compared at test time with a memory cell (hereinafter simply referred to as a "cell") included in the memory cell array 2a. For example, an electric current which flows to a reference cell is compared at erase test time with an electric current which flows to a memory cell in the memory cell array 2a that is an object of an erase test. The selection circuit 2c selects a cell in the memory cell array 2a in accordance with an address inputted, and applies determined voltage. The read-write circuit 2d reads out data from or writes data to a selected cell.

The command generation circuit 3 generates a read command, a write command, an erase command, test mode, or the like in response to a control signal or an address inputted from the outside.

The test control circuit 4 performs a write test, a read test, an erase test, or the like in response to the test mode designated by the command generation circuit 3.

In response to a command generated by the command generation circuit 3 or a signal from the test control circuit 4, the operation control circuit 5 generates a signal for controlling the memory core 2, and supplies it to the selection circuit 2c and the read-write circuit 2d.

In response to a command generated by the command generation circuit 3 or a signal from the test control circuit 4, the address controller 6 controls internal addresses (column address and a row address) generated by the address generation circuit 7.

The address generation circuit 7 accepts an address from the outside and generates internal addresses under the control of the address controller 6.

The data input-output circuit 8 outputs data read out from the memory cell array 2a or inputs data to be written to the memory cell array 2a.

In FIG. 2, a circuit section which generates internal voltage or a circuit section which performs a redundancy function for replacing a bad cell in the memory cell array 2a with a normal cell is not illustrated.

The operation of the semiconductor memory 1 at erase test time will now be described by the use of FIGS. 1 and 2.

As illustrated in FIG. 1, in this embodiment an erase test includes two steps.

(Step S1: First Erase Test)

The test control circuit 4 performs a first erase test on series of memory cells which are included in the memory cell array 2a and which are divided into a plurality of groups by applying an erase pulse until the appearance of a group for which the determination that erase is completed is made.

FIG. 1 illustrates series of memory cells divided into two groups A and B. The series of memory cells are a part of cells in the memory cell array 2a. In the example of FIG. 1, the series of memory cells arranged obliquely to a column direction and a row direction are illustrated.

The test control circuit 4 makes the operation control circuit 5 generate an erase pulse having determined width and apply it to, for example, series of memory cells which include a series of memory cells in each group and which are treated as an erase unit (sector).

In order to determine whether erase is completed for each cell of the series of memory cells, the test control circuit 4 then controls the address controller 6 to make the address generation circuit 7 generate an address for selecting a reference cell for an erase test from the reference cell array 2b. Furthermore, the test control circuit 4 gives the address controller 6 instructions to generate addresses for selecting a series of memory cells in each of the groups A and B.

If the series of memory cells in the example of FIG. 1 are selected, then the address controller 6 gives the address generation circuit 7 instructions to increment or decrement a row address and a column address. By doing so, a cell at the same row address is selected in order in each of the groups A and B. The test control circuit 4 then makes the operation control circuit 5 output a control signal for performing the operation of reading the memory core 2.

The read-write circuit 2d includes, for example, a sense amplifier for comparing a value (drain-source current value, for example) read out from a reference cell with a value read out from a cell selected from a series of memory cells. On the basis of a comparison result, the test control circuit 4 determines whether or not erase is completed for the selected cell. For example, if a current value in the selected cell is greater than a current value in the reference cell, then the test control circuit 4 determines that erase is completed (pass). If the current value in the selected cell is smaller than the current value in the reference cell, then the test control circuit 4 determines that erase is not completed (fail).

If there is a cell which fails in verification among a series of memory cells in each of the groups A and B, then the test control circuit 4 applies an erase pulse one by one until the appearance of one of the groups A and B for which erase is completed, and repeats the same verification that is described above.

As illustrated in FIG. 1, for example, it is assumed that when the number of erase pulses is X, all of the series of memory cells in the group A pass verification. In this case, the test control circuit 4 terminates the first erase test even if a cell which fails in verification or a cell which is not yet verified remains in the group B at the time of the number of erase pulses being X. The test control circuit 4 holds the number of erase pulses (X) at that time.

(Step S2: Second Erase Test)

On the basis of the number of erase pulses at the time of detecting a group in which erase is completed first for a series of memory cells, the test control circuit 4 performs a second erase test on other series of memory cells (all memory cells in a sector, for example) including the above series of memory cells.

As stated above, for example, if erase is completed first for the series of memory cells in the group A, then the number (=X) of erase pulses at that time is applied in the second erase test. The test control circuit 4 performs a erase test on all memory cells in a sector in the same way that is described above. For example, the test control circuit 4 compares all the memory cells in the sector with a reference cell. In the example of FIG. 1, two cells which fail in verification are detected by this erase test. For example, these cells can be replaced with normal cells by a redundancy technique described later.

A value obtained by multiplying the number (X) of erase pulses obtained in the first erase test by a coefficient may be used as the number of erase pulses applied in the second erase test.

In the second erase test a cell for which erase is performed at the time of erase pulses based on the number of erase pulses obtained in the first erase test being applied passes verification. Accordingly, it may safely be said that the number of erase pulses obtained in the first erase test is a verification threshold at the time of the second erase test.

When the first erase test is performed, there may be a cell (cell in the group B of FIG. 1 which fails in verification, for example) which needs a peculiarly long time for erase because of, for example, a problem with a process. Even in that case, the above technique can prevent the number of erase pulses applied in the second erase test from increasing by its influence. That is to say, a rise in a verification threshold and relaxation of a verification standard at the time of the second erase test based on the reason that a part of cells need a long time for erase can be prevented.

Therefore, a cell which needs a long time for erase can be verified with accuracy. By replacing such a cell with a normal cell by the redundancy technique described later, effective erase time for a semiconductor memory can be reduced. Furthermore, a decrease in the reliability of a semiconductor memory caused by the relaxation of a verification standard can be prevented.

In the above description verification is performed by the use of a reference cell. However, a verification method is not limited to this. The test control circuit 4 may verify from, for example, a change in voltage at a terminal of a cell to be tested whether or not erase is performed correctly.

Second Embodiment

Figure 3:
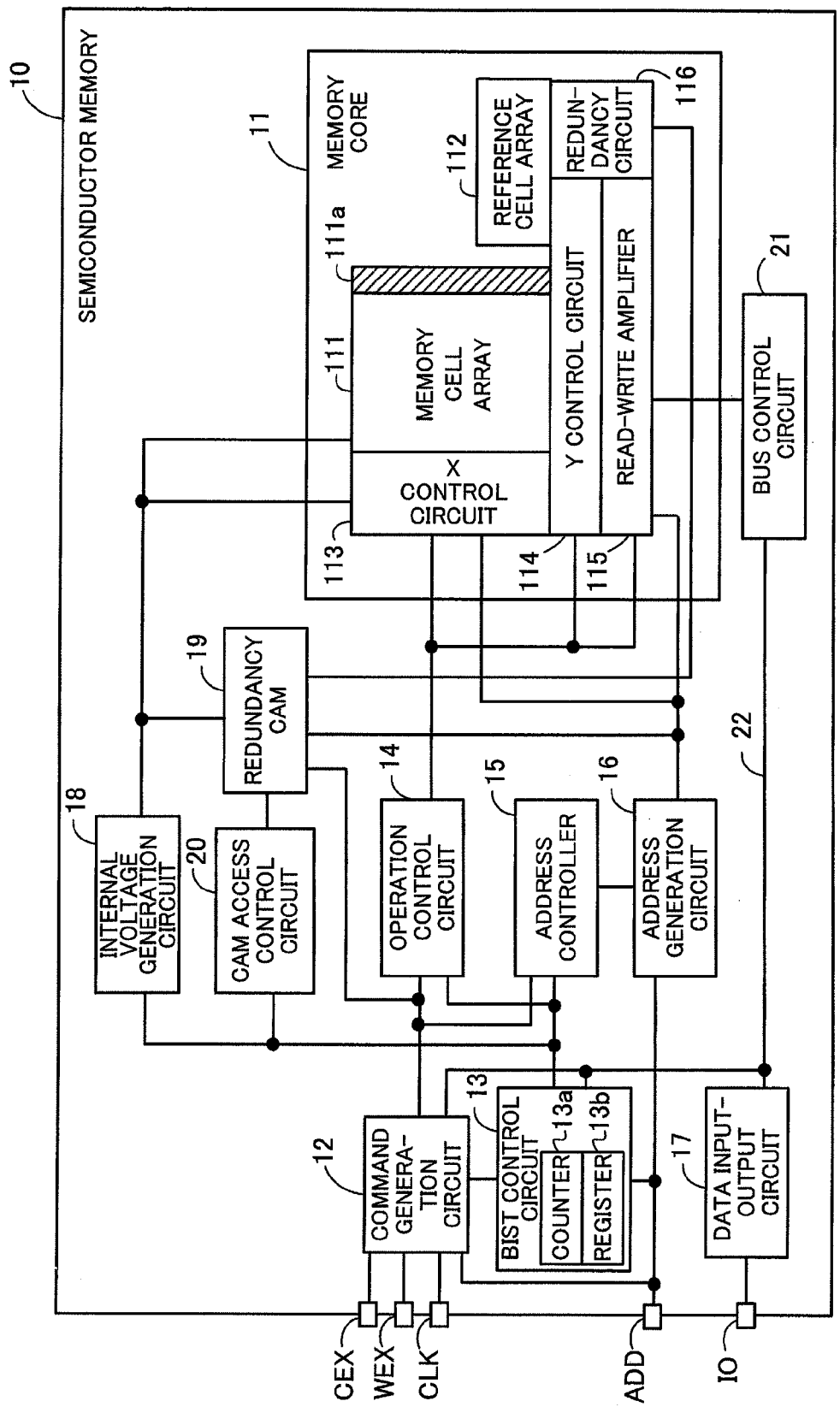
FIG. 3 is an example of a semiconductor memory according to a second embodiment.

FIG. 3 is an example of a semiconductor memory according to a second embodiment.

A semiconductor memory 10 according to a second embodiment is, for example, a flash memory. The semiconductor memory 10 includes a memory core 11, a command generation circuit 12, a GIST (Built-In Self Test) control circuit 13, an operation control circuit 14, an address controller 15, an address generation circuit 16, and a data input-output circuit 17. In addition, the semiconductor memory 10 includes an internal voltage generation circuit 18, a redundancy CAM (Content Addressable Memory) 19, a CAM access control circuit 20, and a bus control circuit 21.

The memory core 11 includes a memory cell array 111, a reference cell array 112, an X control circuit 113, a Y control circuit 114, a read-write amplifier 115, and a redundancy circuit 116.

A plurality of cells are arranged like a matrix in the memory cell array 111. The memory cell array 111 includes a redundant memory cell array 111a. A reference cell compared at test time with a cell included in the memory cell array 111 is included in the reference cell array 112.

In response to a row address generated by the address generation circuit 16 and a control signal from the operation control circuit 14, the X control circuit 113 applies determined voltage to, for example, a gate of a cell included in the memory cell array 111a.

In response to a column address generated by the address generation circuit 16 and a control signal from the operation control circuit 14, the Y control circuit 114 applies determined voltage to a bit line of a memory cell included in the memory cell array 111a and the read-write amplifier 115 performs read or write operation.

The redundancy circuit 116 has the functions of the Y control circuit 114 and the read-write amplifier 115 on the redundant memory cell array 111a.

The command generation circuit 12 is connected to external terminals CEX, WEX, and CLK and an address terminal ADD. In response to a chip enable signal, a write enable signal, a clock signal, and an address inputted from these terminals, the command generation circuit 12 generates a read command, a write command, an erase command, a test mode, or the like.

The BIST control circuit 13 has the function of the test control circuit 4 illustrated in FIG. 2 and performs a write test, a read test, an erase test, or the like according to a test mode designated by the command generation circuit 12. The BIST control circuit 13 has the function of determining whether or not erase is performed correctly in an erase test. Furthermore, the BIST control circuit 13 includes a counter 13a for counting the number of erase pulses and a register 13b for storing an address of a cell which fails at erase test time. The counter 13a and the register 13b may be placed outside the BIST control circuit 13.

In response to a command generated by the command generation circuit 12 or a signal from the BIST control circuit 13, the operation control circuit 14 generates a signal for controlling the memory core 11, and supplies it to the X control circuit 113, the Y control circuit 114, and the read-write amplifier 115.

In response to a command generated by the command generation circuit 12 or a signal from the BIST control circuit 13, the address controller 15 controls internal addresses (column address and a row address) generated by the address generation circuit 16.

The address generation circuit 16 inputs an external address from the address terminal ADD and generates internal addresses in accordance with instructions from the address controller 15. There are a plurality of address terminals ADD (not illustrated).

The data input-output circuit 17 is connected to an input-output terminal IO. The data input-output circuit 17 outputs data read out from the memory cell array 111 or inputs data to be written to the memory cell array 111. There are a plurality of input-output terminals IO (not illustrated).

The internal voltage generation circuit 18 generates various internal voltages on the basis of a control signal supplied from the BIST control circuit 13 and supplies them to the redundancy CAM 19, the X control circuit 113, and the memory cell array 111.

The redundancy CAM 19 holds addresses of a bad cell replaced. The CAM access control circuit 20 controls write access, read access, or the like to the redundancy CAM 19 on the basis of a control signal from the BIST control circuit 13.

The bus control circuit 21 is connected between the data input-output circuit 17 and the read-write amplifier 115 and controls data carried by a bus 22.

(Erase Test by Semiconductor Memory 10)

Figure 4:
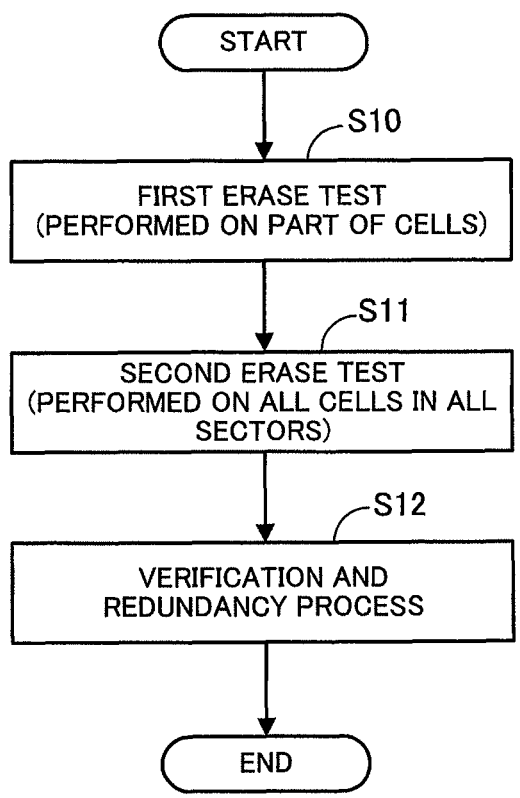
FIG. 4 is a flow chart of an example of an erase test.

FIG. 4 is a flow chart of an example of an erase test.

As indicated in FIG. 4, an erase test includes three steps.

(Step S10: First Erase Test)

A first erase test is performed on series of memory cells which is a part of a sector that is an erase unit in the memory cell array 111. The series of memory cells which is a part of the sector are divided into a plurality of groups. At the time when a first group in which erase is completed appears, the number of erase pulses applied to the sector is held and the first erase test on the sector terminates.

(Step S11: Second Erase Test)

A second erase test is performed on all cells in all sectors. On the basis of a value (hereinafter referred to as a "MAX pulse number") obtained by multiplying the number of erase pulses in each sector found in step S10 by a determined coefficient, an erase test is performed on all cells in each sector. The reason for doing a multiplication by the use of a coefficient is as follows. The first erase test is performed on a part of memory cells in a sector, so there is a possibility that the states of all the cells in the sector are not reflected. This coefficient is set empirically on the basis of, for example, the results of past erase tests.

In the second erase test information (flag value) indicative of a sector including a cell for which erase cannot be performed by erase pulses the number of which corresponds to a MAX pulse number is stored in the register 13b of the BIST control circuit 13.

(Step S12: Verification and Redundancy Process)

Verification is performed on all cells in a sector including a cell for which erase cannot be performed by erase pulses the number of which corresponds to a MAX pulse number. A cell which fails in verification is then replaced with a cell included in the redundant memory cell array 111a. A sector including a cell which fails in verification may be replaced with a series of cells included in the redundant memory cell array 111*a*.

Each step will now be described in detail.

(First Erase Test)

In the first erase test the address controller 15 controlled by the BIST control circuit 13 selects, for example, a part of cells included in each sector in the following way.

Figure 5:
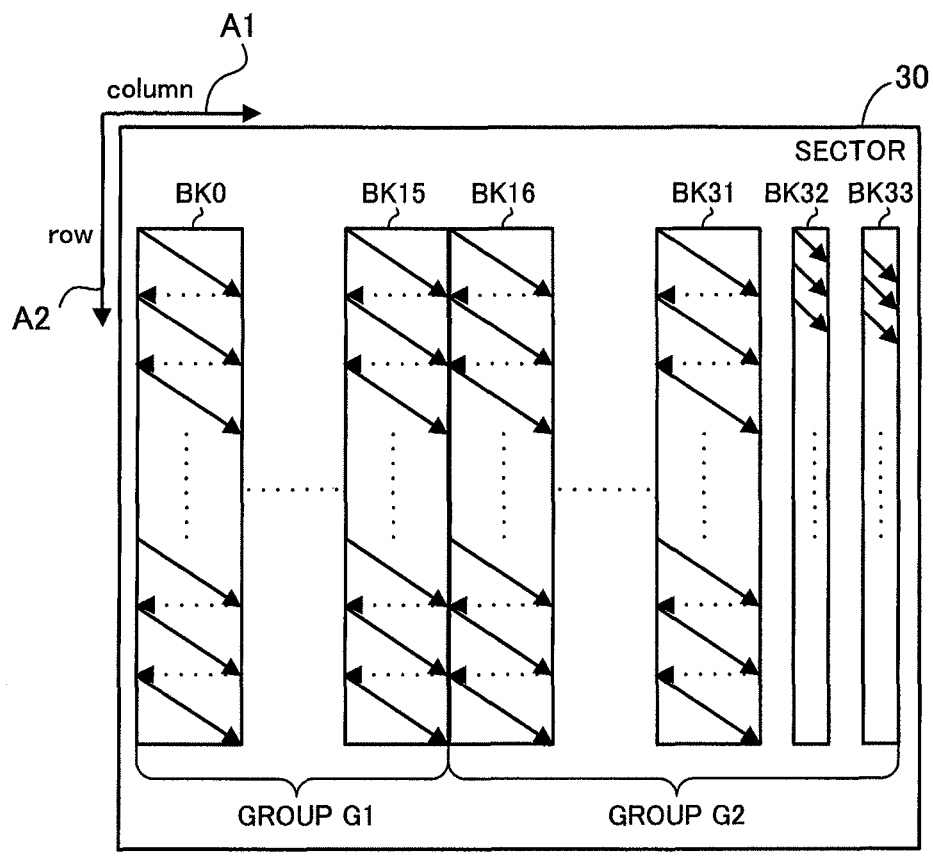
FIG. 5 is an example of an address sequence in a sector designated in a first erase test.

FIG. 5 is an example of an address sequence in a sector designated in the first erase test.

A sector 30 includes, for example, blocks BK0, ..., BK15, BK16, ..., BK31 each including a plurality of cells and blocks BK32 and BK33 each including redundant cells. For example, the blocks BK0 through BK31 correspond to 32 input-output terminals IO and data inputted from these input-output terminals IO is written to the blocks BK0 through BK31.

In the above sector 30 the address controller 15 increments or decrements a column address and a row address in each of the blocks BK0 through BK33 to designate addresses in an oblique direction as illustrated in FIG. 5. For example, it is assumed that an arrow A1 indicates a direction in which a column address decreases and that an arrow A2 indicates a direction in which a row address decreases. Then addresses indicated in FIG. 5 are designated by decrementing both of a column address and a row address. By doing so, a cell at the same row address is selected in order in each of the blocks BK0 through BK33.

A method for selecting a part of cells in each sector is not limited to the above example. For example, cells at a corner of a sector may be selected.

In the following description it is assumed that the BIST control circuit 13 considers a series of cells selected in the blocks BK0 through BK15 as a group G1, considers a series of cells selected in the blocks BK16 through BK33 as a group G2, and performs the erase test.

However, a method for grouping is not limited to this example. Grouping may be performed in the row direction. In that case, the erase test may be performed by incrementing or decrementing a column address and a row address and selecting a cell at the same column address in each group.

Furthermore, it is assumed that a cell in the memory cell array 111 is in a write state at the beginning of the first erase test.

Figure 6:
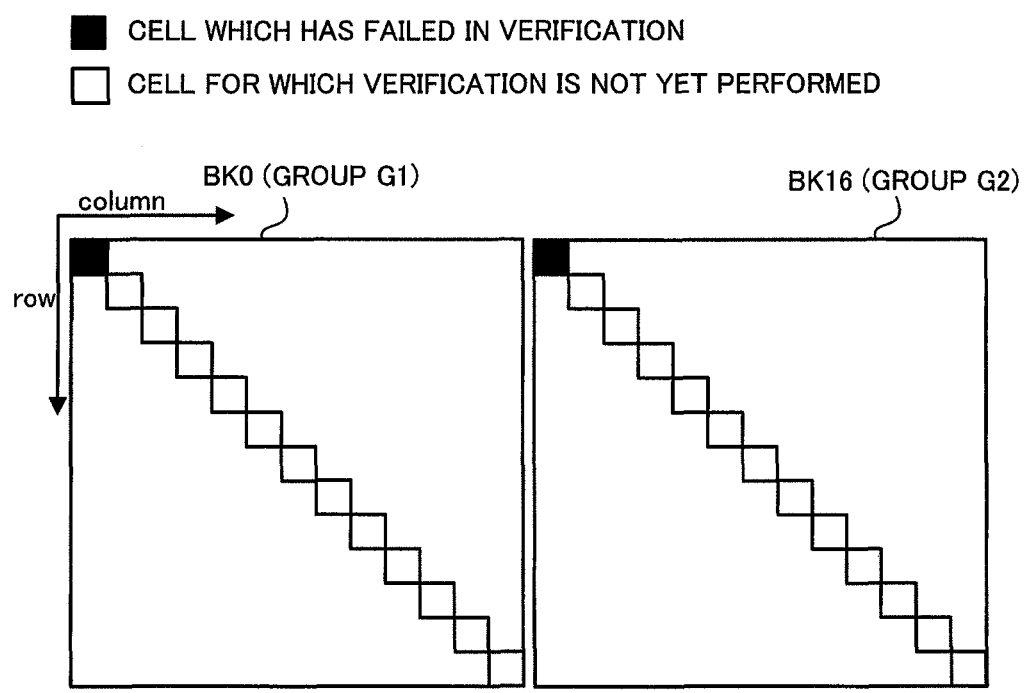
FIG. 6 indicates the state of each cell just after the beginning of the first erase test.

FIG. 6 indicates the state of each cell just after the beginning of the first erase test.

FIG. 6 indicates the states of cells which are objects of verification and which are included in the block BK0 that belongs to the group G1 illustrated in FIG. 5 and the block BK16 that belongs to the group G2 illustrated in FIG. 5. A black cell indicates that it has failed in verification. A white cell indicates that verification is not yet performed on it.

First the BIST control circuit 13 performs erase verification on a top left-hand cell of each of the blocks BK0 and BK16. In a state in which an erase pulse is not applied, however, a verification result is a fail as indicated in FIG. 6. Until the verification result of a pass is obtained for a first cell in each block, the BIST control circuit 13 adds an erase pulse to be applied to all cells in the sector and counts the number of erase pulses by the counter 13*a*.

Figure 7:
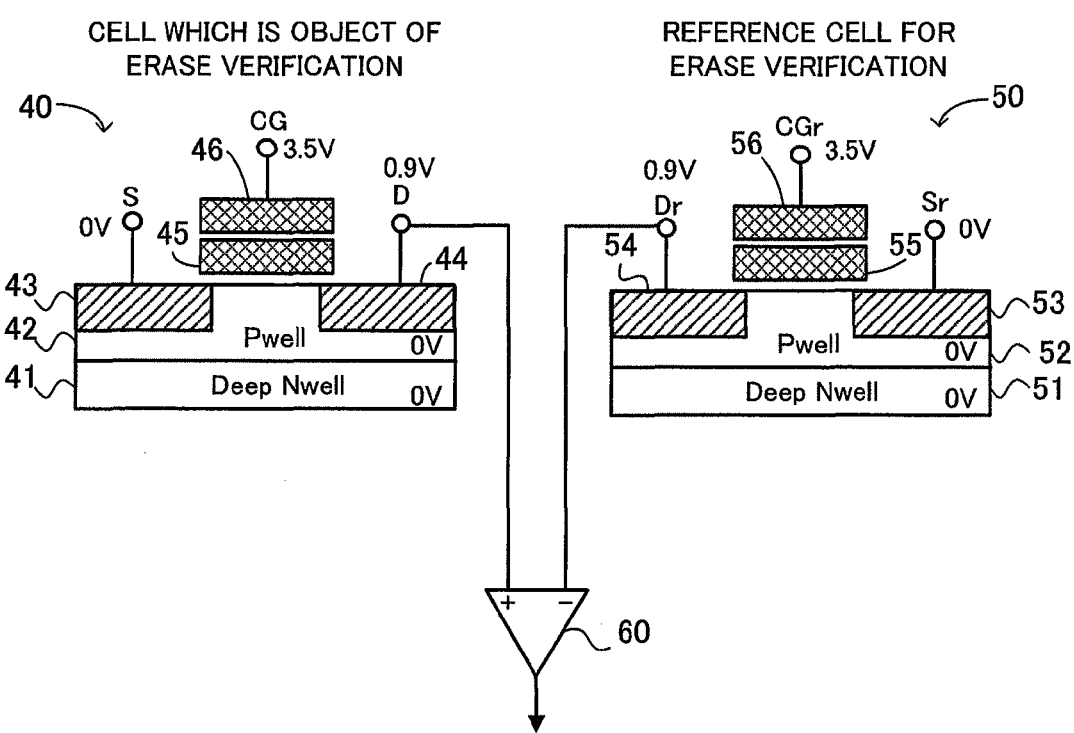
FIG. 7 is an example of erase verification.

FIG. 7 is an example of erase verification.

At erase verification time a cell 40 which is included in the memory cell array 111 illustrated in FIG. 3 and which is an object of erase verification and a reference cell 50 for erase verification which is included in the reference cell array 112 are connected to a sense amplifier 60 and a current comparison is made. The sense amplifier 60 is included in, for example, the read-write amplifier 115 of the memory core 11 illustrated in FIG. 3. The connection of the reference cell 50 and the cell 40 to the sense amplifier 60 is controlled by, for example, the Y control circuit 114.

In the example of FIG. 7, the reference cell 50 and the cell 40 are flash memory cells. Source regions 43 and 53 and drain regions 44 and 54 are formed in p wells 42 and 52 formed in deep n wells 41 and 51 respectively. In addition, floating gates 45 and 55 and control gates 46 and 56 are formed.

In order to put the reference cell 50 and the cell 40 into a read state at erase verification time, a source terminal S connected to the deep n well 41, the p well 42, and the source region 43 and a source terminal Sr connected to the deep n well 51, the p well 52, and the source region 53 are set to, for example, 0 V. Furthermore, a voltage of 0.9 V is applied to a drain terminal D connected to the drain region 44 and a drain terminal Dr connected to the drain region 54. A voltage of 3.5 V is applied to a control gate terminal CG connected to the control gate 46 and a control gate terminal CGr connected to the control gate 56.

Figure 8:
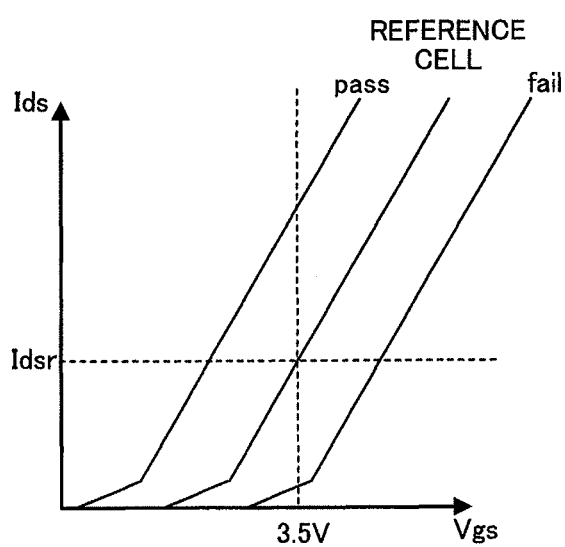
FIG. 8 is an example of a determination standard for erase verification.

FIG. 8 is an example of a determination standard for erase verification. A horizontal axis indicates gate-source voltage Vgs and a vertical axis indicates drain-source current Ids.

In the Vgs-Ids characteristic of the reference cell 50 it is assumed that when the gate-source voltage Vgs is 3.5 V, the drain-source current Ids is Idsr. If the drain-source current Ids of the cell 40 which is an object of erase verification is higher than Idsr, then the sense amplifier 60 outputs "1" and the BIST control circuit 13 determines that the cell 40 has passed verification. If the drain-source current Ids of the cell 40 which is an object of erase verification is lower than Idsr, then the sense amplifier 60 outputs and the BIST control circuit 13 determines that the cell 40 has failed in verification.

For example, when the BIST control circuit 13 detects that a verification result of a first cell in each of the blocks BK0 through BK33 is a "pass", the BIST control circuit 13 makes the address controller 15 designate addresses in the oblique direction illustrated in FIG. 5. The BIST control circuit 13 then performs erase verification on a cell selected on the basis of addresses designated. If a cell which fails in verification is detected in a group, then the BIST control circuit 13 stores the addresses of the cell in the register 13*b*. Until a cell which fails in verification is detected in both of the groups G1 and G2, the BIST control circuit 13 makes the address controller 15 designate addresses.

Figure 9:
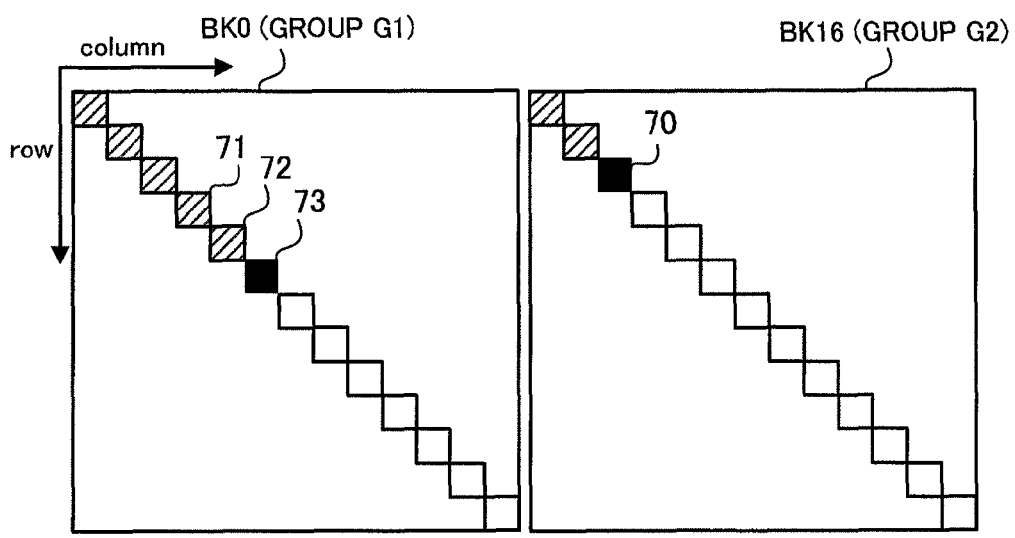
FIG. 9 illustrates a state at the time of a cell that fails in verification being detected in all groups.

FIG. 9 illustrates a state at the time of a cell that fails in verification being detected in all the groups. FIG. 9 illustrates the states of cells which are objects of erase verification and which are included in the block BK0 that belongs to the group G1 illustrated in FIG. 5 and the block BK16 that belongs to the group G2 illustrated in FIG. 5. A cell in which slant lines are drawn indicates that it has passed verification. A black cell indicates that it has failed in verification. A white cell indicates that verification is not yet performed on it.

If cells which are objects of erase verification have all passed verification in each block which belongs to the group G1 at the time of a cell 70 which has failed in verification being detected in the block BK16 which belongs to the group G2, then the addresses of the cell 70 are stored in the register 13*b* and then addresses are designated. In the block BK0 which belongs to the group G1, as illustrated in FIG. 9, erase verification is performed on cells 71, 72, and 73. In the example of FIG. 9, the determination that the cell 73 has failed in verification is made.

When a cell which fails in verification is detected in all the groups in this way, the BIST control circuit 13 makes the operation control circuit 14 add an erase pulse. After that, the BIST control circuit 13 reads out the addresses of the cell 70 stored. The BIST control circuit 13 resumes verification from cells in the blocks BK0 through BK33 which are objects of erase verification and row addresses of which are the same as that of the cell 70, and stores the addresses of a cell for which the determination that failure in verification occurs is made first. The BIST control circuit 13 then makes the address controller 15 designate addresses until the BIST control circuit 13 detects a cell which fails in verification in both of the groups G1 and G2.

Figure 10:
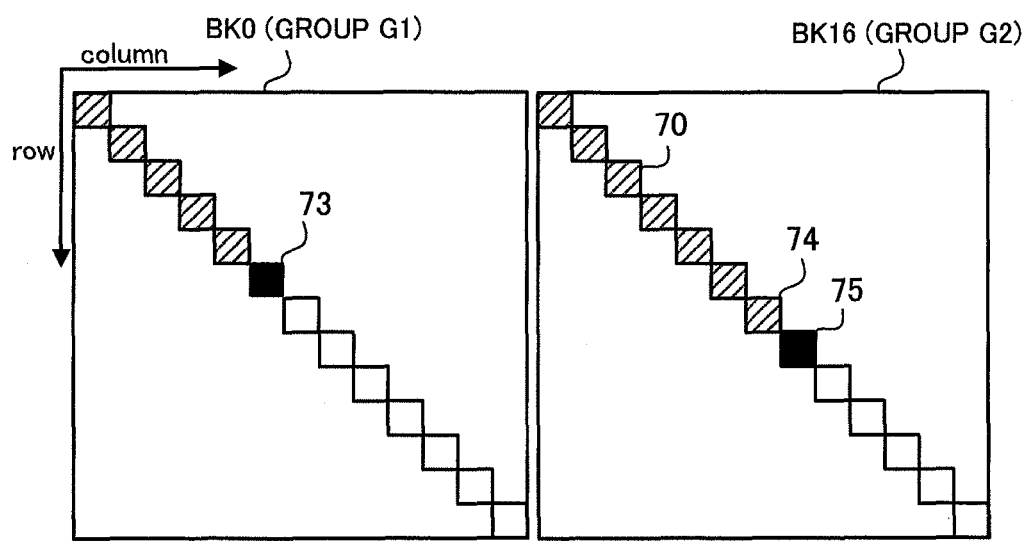
FIG. 10 is an example of the state of each cell during the first erase test.

FIG. 10 is an example of the state of each cell during the first erase test. FIG. 10 indicates the state of each cell after adding an erase pulse in the state indicated in FIG. 9.

By adding an erase pulse, the cell 70 in the block BK16 which belongs to the group G2 passes verification. However, the cell 73 in the block BK0 which belongs to the group G1 still fails in verification. If cells in the blocks BK16 through BK33 in the group G2 the row addresses of which are the same as that of the cell 73 have all passed verification, then the BIST control circuit 13 stores the addresses of the cell 73 and makes the address controller 15 designate addresses.

As illustrated in FIG. 10, erase verification is performed on cells 74 and 75 in the block BK16 in the group G2. In the example of FIG. 10, the determination that the cell 75 fails in verification is made. Accordingly, the BIST control circuit 13 makes the operation control circuit 14 add an erase pulse again. After that, the BIST control circuit 13 reads out the addresses of the cell 73 stored. The BIST control circuit 13 resumes verification from cells in the blocks BK0 through BK33 which are objects of erase verification and the row addresses of which are the same as that of the cell 73.

By proceeding with the above process, all cells in a block in a group which are objects of erase verification pass verification.

Figure 11:
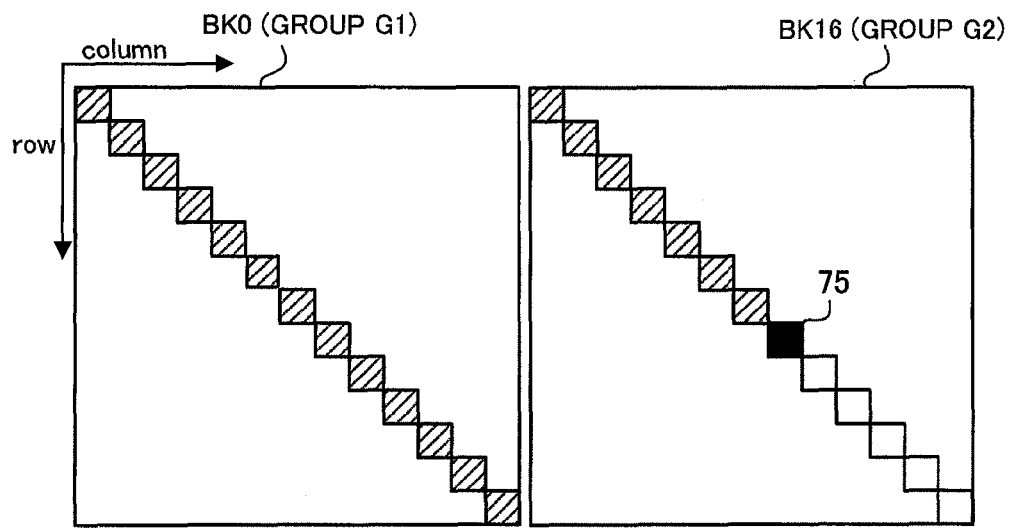
FIG. 11 illustrates a state in which all cells in a block in a group that are objects of erase verification have passed verification.

FIG. 11 illustrates a state in which all cells in a block in a group that are objects of erase verification have passed verification.

In the example of FIG. 11, all cells in the block BK0 in the group G1 which are objects of erase verification are in a state in which they have passed verification. When all cells in another block in the group. G1 which are objects of erase verification are also in a state in which they have passed verification, the first erase test on the sector 30 terminates even if the group G2 includes the cell 75 which has failed in verification. The BIST control circuit 13 holds the number of erase pulses at this time.

The above first erase test is performed on all sectors in the memory cell array 111.

In the above description the addresses of a cell which fails first in verification are stored in the register 13b included in the BIST control circuit 13. However, the addresses of all cells which fail in verification may be stored.

The flow of the first erase test will now be described by the use of a flow chart.

Figure 12:
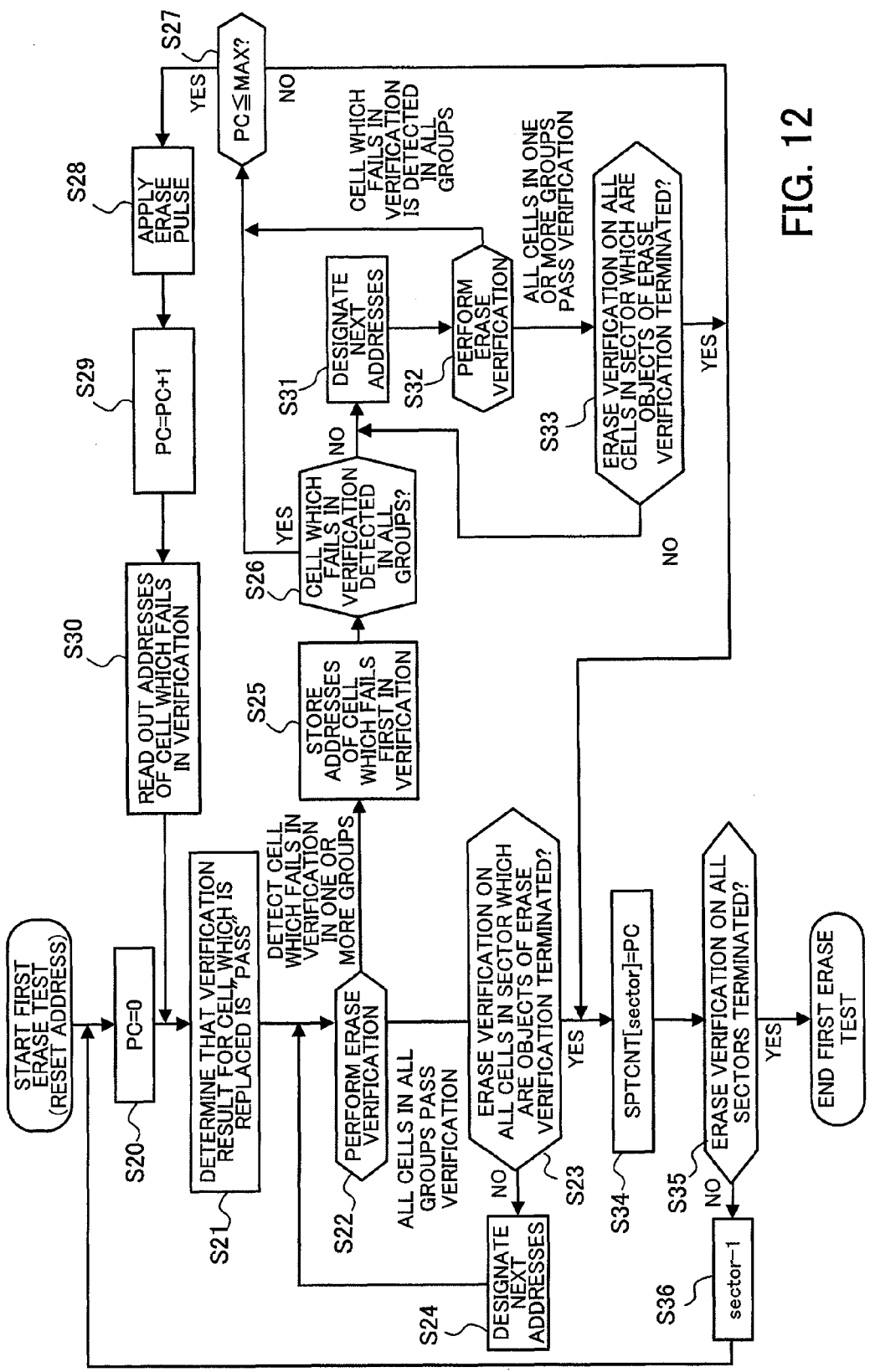
FIG. 12 is a flow chart of an example of the first erase test.

FIG. 12 is a flow chart of an example of the first erase test.

At the beginning of the first erase test, the BIST control circuit 13 controls the address controller 15 to make it reset an address generated by the address generation circuit 16. As a result, in the example of FIG. 5 top left-hand addresses are designated in the blocks BK0 through BK33 in the sector 30. Accordingly, cells designated by these addresses are selected.

(Step S20) The BIST control circuit 13 sets a counter value PC of the counter 13a to 0. A counter value indicates the number of erase pulses.

(Step S21) The BIST control circuit 13 acquires from the CAM access control circuit 20 addresses of a bad cell held in the redundancy CAM 19. The cell designated by these addresses is replaced (with a cell in the redundant memory cell array 111a), so the BIST control circuit 13 determines that a verification result for the cell is a "pass".

(Step S22) The BIST control circuit 13 performs erase verification by, for example, the method illustrated in FIG. 7. Erase verification is performed in order on cells selected in each group. In the example of FIG. 5, for example, erase verification is performed after the address reset on the first cells in the blocks BK0 through BK33 which belong to the groups G1 and G2. However, the cell for which the BIST control circuit 13 determines in step S21 that a verification result is a "pass" is omitted.

If the BIST control circuit 13 detects a cell which fails in verification in one or more groups, then the BIST control circuit 13 proceeds to step S25. If the BIST control circuit 13 detects that all cells in all groups pass verification, then the BIST control circuit 13 proceeds to step S23.

(Step S23) The BIST control circuit 13 determines whether or not erase verification on all cells in a sector which are objects of erase verification (in the example of FIG. 5, all cells in the blocks BK0 through BK33 designated by addresses indicated by arrows) has terminated. If the BIST control circuit 13 determines that erase verification on all cells in the sector which are objects of erase verification has terminated, then the BIST control circuit 13 proceeds to step S34. If the BIST control circuit 13 determines that erase verification on all cells in the sector which are objects of erase verification has not terminated, then the BIST control circuit 13 proceeds to step S24.

(Step S24) If the BIST control circuit 13 determines that erase verification on all cells in the sector which are objects of erase verification has not terminated, then the BIST control circuit 13 makes the address controller 15 designate the next addresses in the sector. After step S24, a process is repeated from step S22.

(Step S25) The BIST control circuit 13 stores in the register 13b addresses of a cell which fails first in verification in the erase verification in step S22. The BIST control circuit 13 may include one register 13b or include registers 13b according to groups.

(Step S26) The BIST control circuit 13 determines whether or not a cell which fails in verification is detected in all the groups. If a cell which fails in verification is detected in all the groups, then the BIST control circuit 13 proceeds to step S27. If a cell which fails in verification is not detected in all the groups, then the BIST control circuit 13 proceeds to step S31.

(Step S27) The BIST control circuit 13 determines whether or not the counter value PC of the counter 13a is smaller than or equal to MAX. MAX is the upper limit value of the number of erase pulses. If PC≤MAX, then the BIST control circuit 13 proceeds to step S28. If PC>MAX, then the BIST control circuit 13 proceeds to step S34.

(Step S28) The BIST control circuit 13 makes the operation control circuit 14 apply an erase pulse with determined width to all the cells in the sector. As a result of the application of an erase pulse, for example, a voltage of −9.3 V is applied to a control gate of each cell and a voltage of +9.3 V is applied to its p well.

(Step S29) The BIST control circuit 13 adds 1 to the counter value PC of the counter 13a.

(Step S30) The BIST control circuit 13 reads out the addresses stored in the register 13b in step S25 of the cell which fails in verification. A process is then repeated from step S21 at these addresses.

(Step S31) If the determination that all cells in a group pass verification is made in step S26, then the BIST control circuit 13 makes the address controller 15 designate the next addresses in the sector.

(Step S32) The BIST control circuit 13 performs erase verification on a cell in each block in a group in which a cell that fails in verification is not detected. If all cells in one or more groups pass verification, then the BIST control circuit 13 proceeds to step S33. If a cell which fails in verification is detected in all the groups, then the BIST control circuit 13 proceeds to step S27. In the example of FIG. 9, for example, the determination that the cell 73 in the block BK0 in the group G1 fails in verification is made. At this time a cell which fails in verification is detected in all the groups. Accordingly, the above step S27 is performed.

(Step S33) The BIST control circuit 13 determines whether or not erase verification on all cells in the sector which are objects of erase verification has terminated. If the BIST control circuit 13 determines that erase verification on all cells in the sector which are objects of erase verification has terminated, then the BIST control circuit 13 proceeds to step S34. If the BIST control circuit 13 determines that erase verification on all cells in the sector which are objects of erase verification has not terminated, then the BIST control circuit 13 proceeds to step S31.

(Step S34) The BIST control circuit 13 holds a value. SPTCNT[sector] indicative of the number of erase pulses in the sector to which the above process is applied in the register 13b of the BIST control circuit 13 as the counter value PC. The variable "sector" is, for example, the number of sectors or a sector number.

(Step S35) The BIST control circuit 13 determines whether or not erase verification on all the sectors has terminated. For example, the BIST control circuit 13 refers to the variable "sector". If sector=1, then the BIST control circuit 13 determines that erase verification on all the sectors has terminated, and terminates the first erase test. If the BIST control circuit 13 determines that erase verification on all the sectors has not terminated, then the BIST control circuit 13 proceeds to step S36.

(Step S36) In order to perform the first erase test on the next sector, the BIST control circuit 13 subtracts 1 from the value of the variable "sector". The BIST control circuit 13 then performs a process on the next sector from step S20.

(Second Erase Test)

The second erase test is performed on all the cells in all the sectors. An erase test is performed on all cells in each sector on the basis of a value SPTCNT[sector] indicative of the number of erase pulses in each sector found by the first erase test.

Figure 13:
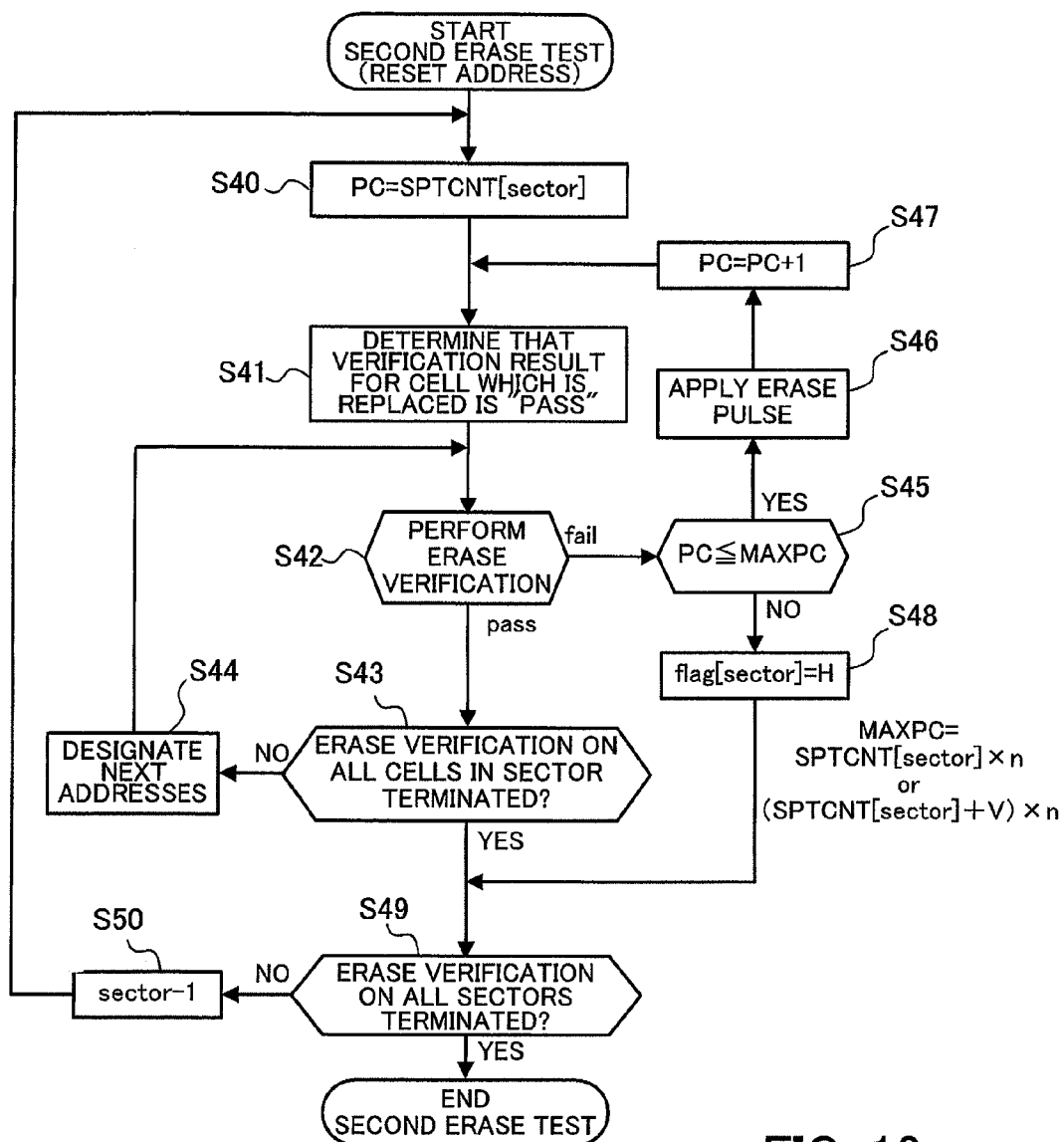
FIG. 13 is a flow chart of an example of a second erase test.

FIG. 13 is a flow chart of an example of the second erase test.

At the beginning of the second erase test, the BIST control circuit 13 controls the address controller 15 to make it reset an address generated by the address generation circuit 16. As a result, a cell designated by first addresses in a sector is selected.

Furthermore, each cell in a sector is in a state in which erase pulses the number of which is indicated by SPTCNT[sector] have been applied by the above first erase test.

(Step S40) The BIST control circuit 13 sets SPTCNT[sector] which indicates the number of erase pulses obtained by first erase test in the counter 13a for a first sector on which the second erase test is to be performed. That is to say, the BIST control circuit 13 makes PC equal to SPTCNT[sector].

(Step S41) The BIST control circuit 13 acquires from the CAM access control circuit 20 addresses of a bad cell held in the redundancy CAM 19. The cell designated by these addresses is replaced, so the BIST control circuit 13 determines that a verification result for the cell is a "pass".

(Step S42) The BIST control circuit 13 performs erase verification by, for example, the method illustrated in FIG. 7. In the second erase test erase verification is performed in order on all cells in each sector. However, the cell for which the BIST control circuit 13 determines in step S41 that a verification result is a "pass" is omitted. If a selected cell fails in erase verification, then the BIST control circuit 13 proceeds to step S45. If a selected cell passes erase verification, then the BIST control circuit 13 proceeds to step S43.

(Step S43) The BIST control circuit 13 determines whether or not erase verification on all cells in a sector has terminated. If the BIST control circuit 13 determines that erase verification on all the cells in the sector has terminated, then the BIST control circuit 13 proceeds to step S49. If the BIST control circuit 13 determines that erase verification on all the cells in the sector has not terminated, then the BIST control circuit 13 proceeds to step S44.

(Step S44) If the BIST control circuit 13 determines that erase verification on all the cells in the sector has not terminated, then the BIST control circuit 13 makes the address controller 15 designate the next addresses in the sector. After step S44, a process is repeated from step S42.

(Step S45) The BIST control circuit 13 determines whether or not the counter value PC of the counter 13a is smaller than or equal to MAXPC. MAXPC is a MAX pulse number indicated by (SPTCNT[sector]×n (determined coefficient)). If MAXPC is greater than or equal to MAX which is the upper limit value of the number of erase pulses, then MAXPC is considered to be equal to MAX. If PC≤MAXPC, then the BIST control circuit 13 proceeds to step S46. If PC>MAXPC, then the BIST control circuit 13 proceeds to step S48. Alternatively, MAXPC may be indicated by ((SPTCNT[sector]+V (determined fixed value))×n) (see Modification described later).

(Step S46) The BIST control circuit 13 makes the operation control circuit 14 apply an erase pulse with determined width to all cells in a sector. As a result of the application of an erase pulse, for example, a voltage of −9.3 V is applied to a control gate of each cell and a voltage of +9.3 V is applied to its p well.

(Step S47) The BIST control circuit 13 adds 1 to the counter value PC of the counter 13a and repeats a process from step S41.

(Step S48) If PC>MAXPC, then the BIST control circuit 13 sets, for example, a flag value flag[sector] stored in the register 13b to H, and proceeds to step S49.

(Step S49) The BIST control circuit 13 determines whether or not erase verification on all the sectors has terminated. For example, the BIST control circuit 13 refers to the variable "sector". If sector=1, then the BIST control circuit 13 determines that erase verification on all the sectors has terminated, and terminates the second erase test. If the BIST control circuit 13 determines that erase verification on all the sectors has not terminated, then the BIST control circuit 13 proceeds to step S50.

(Step S50) In order to perform the second erase test on the next sector, the BIST control circuit 13 subtracts 1 from the value of the variable "sector". The BIST control circuit 13 then performs a process on the next sector from step S40.

(Verification and Redundancy Process)

A verification and redundancy process is performed on all cells in a sector for which the flag value flag[sector] is H.

Figure 14:
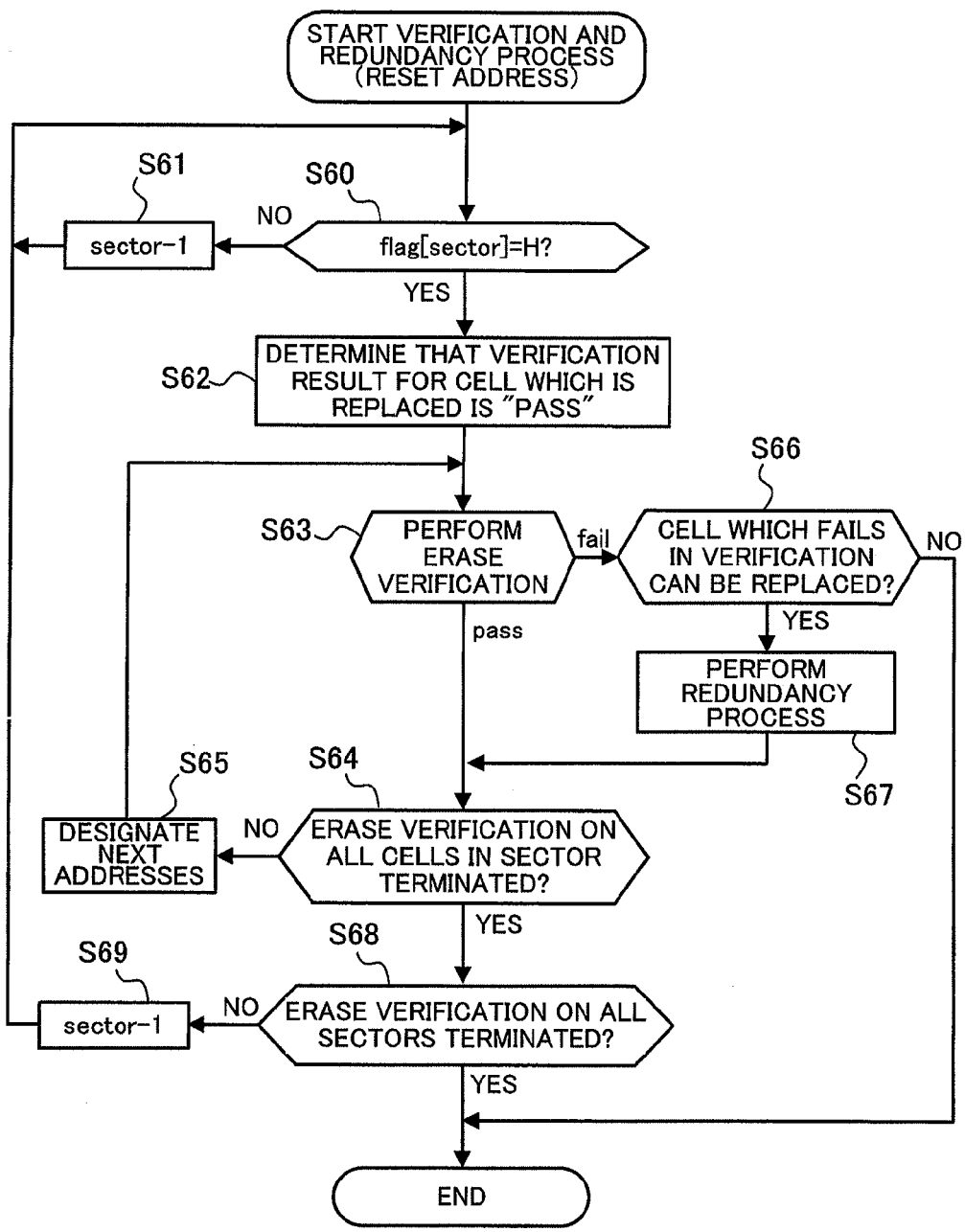
FIG. 14 is a flow chart of an example of a verification and redundancy process.

FIG. 14 is a flow chart of an example of a verification and redundancy process.

At the beginning of the verification and redundancy process, the BIST control circuit 13 controls the address controller 15 to make it reset an address generated by the address generation circuit 16. As a result, first addresses in a sector are designated and a cell designated by these addresses is selected.

(Step S60) The BIST control circuit 13 reads out the flag value flag[sector] for the sector from, for example, the register 13b and determines whether or not flag[sector] is H. If flag[sector] is H, then the BIST control circuit 13 proceeds to step S62. If flag[sector] is not H, then the BIST control circuit 13 proceeds to step S61.

(Step S61) The BIST control circuit 13 subtracts 1 from the value of the variable "sector". The BIST control circuit 13 then makes the determination described in step S60 on the flag value flag[sector] for the next sector.

(Step S62) The BIST control circuit 13 acquires from the CAM access control circuit 20 addresses of a bad cell held in the redundancy CAM 19. The cell designated by these addresses in the selected sector is replaced, so the BIST control circuit 13 determines that a verification result for the cell is a "pass".

(Step S63) The BIST control circuit 13 performs erase verification by, for example, the method illustrated in FIG. 7. Erase verification is performed in order on all cells in a sector for which flag[sector] is H. However, the cell for which the BIST control circuit 13 determines in step S62 that a verification result is a "pass" is omitted. If a selected cell fails in erase verification, then the BIST control circuit 13 proceeds to step S66. If a selected cell passes erase verification, then the BIST control circuit 13 proceeds to step S64.

(Step S64) The BIST control circuit 13 determines whether or not erase verification on all the cells in the sector has terminated. If the BIST control circuit 13 determines that erase verification on all the cells in the sector has terminated, then the BIST control circuit 13 proceeds to step S68. If the BIST control circuit 13 determines that erase verification on all the cells in the sector has not terminated, then the BIST control circuit 13 proceeds to step S65.

(Step S65) If the BIST control circuit 13 determines that erase verification on all the cells in the sector has not terminated, then the BIST control circuit makes the address controller 15 designate the next addresses in the sector. After step S65, a process is repeated from step S63.

(Step S66) The BIST control circuit 13 inquires of the CAM access control circuit 20 whether or not a cell which fails in verification can be replaced. For example, if there remains a replacement cell in the redundant memory cell array 111a, then the CAM access control circuit 20 determines that the cell which fails in verification can be replaced. As a result, step S67 is performed. For example, if there remains no replacement cell, then the CAM access control circuit 20 determines that the cell which fails in verification cannot be replaced, and the verification and redundancy process is terminated (fail stop).

(Step S67) Under the control of the BIST control circuit 13, the CAM access control circuit 20 performs a redundancy process for replacing the cell which fails in verification with a cell in the redundant memory cell array 111a. At this time addresses of the cell which fails in verification are stored in the redundancy CAM 19. When the addresses of this cell are designated, the redundancy circuit 116 selects the cell in the redundant memory cell array 111a with which this cell is replaced.

(Step S68) The BIST control circuit 13 determines whether or not erase verification on all sectors has terminated. For example, the BIST control circuit 13 refers to the variable "sector". If sector=1, then the BIST control circuit 13 determines that erase verification on all sectors for which flag [sector] is H has terminated, and terminates the verification and redundancy process. If the BIST control circuit 13 determines that erase verification on all the sectors for which flag[sector] is H has not terminated, then the BIST control circuit 13 proceeds to step S69.

(Step S69) The GIST control circuit 13 subtracts 1 from the value of the variable "sector" and performs a process on the next sector from step S60.

When the first erase test is performed, there may be a cell which needs a peculiarly long time for erase. Even in that case, the above technique can prevent the number of erase pulses applied in the second erase test from increasing by its influence. That is to say, a rise in a verification threshold and relaxation of a verification standard at the time of the second erase test based on the reason that a part of cells need a long time for erase can be prevented.

Therefore, a cell which needs a long time for erase can be verified with accuracy. By replacing such a cell by a redundancy process, effective erase time for a semiconductor memory can be reduced. Furthermore, the reliability of a semiconductor memory can be improved.

In addition, as illustrated in FIG. 5, for example, the address controller 15 designates addresses in the blocks BK0 through BK33 in the sector 30 by the same method (by incrementing or decrementing a column address and a row address) at the time of the first erase test. Therefore, a process performed by the address controller 15 can be simplified and an increase in circuit scale can be controlled.

MODIFICATION

Figure 15:
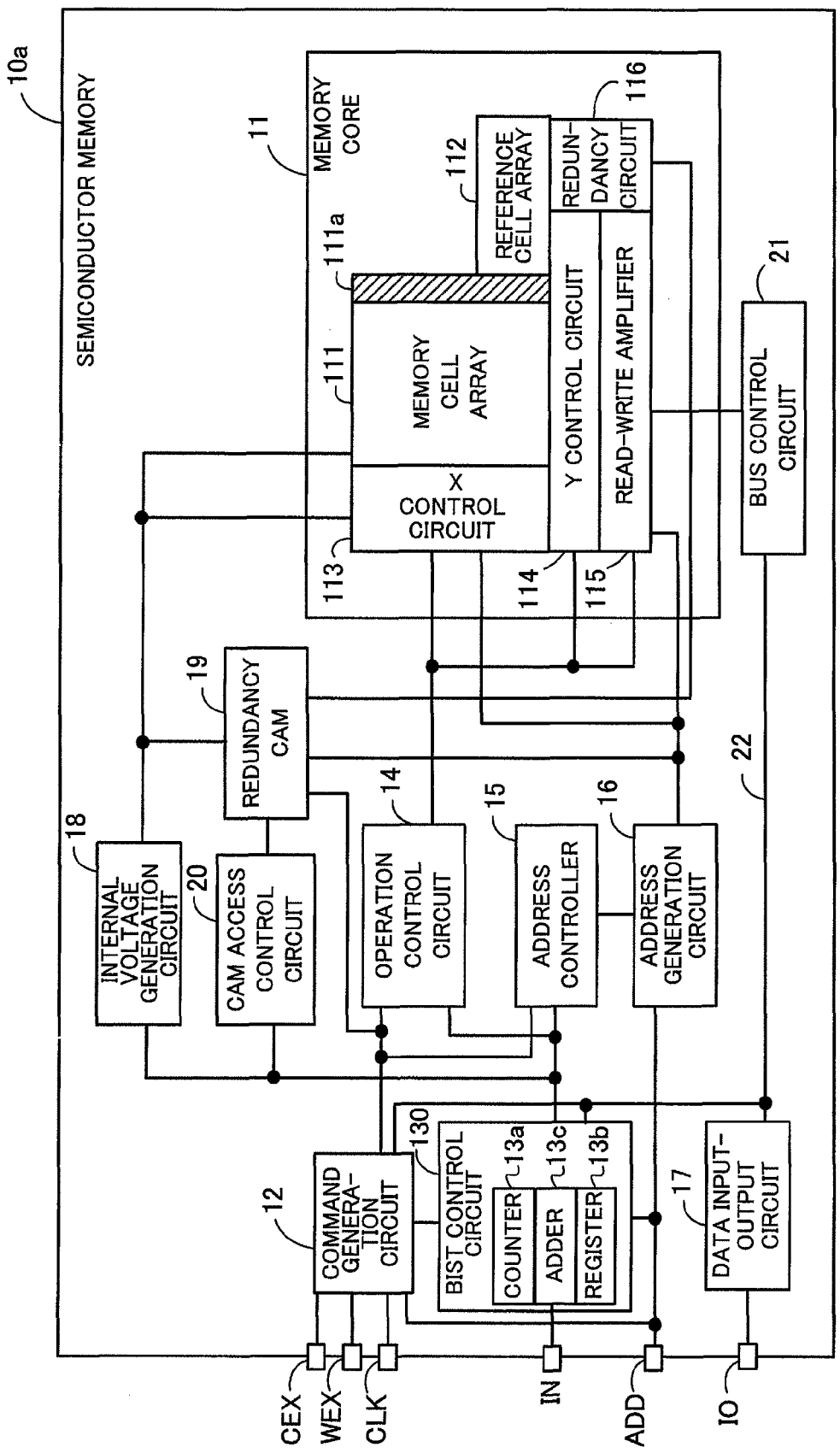
FIG. 15 illustrates a modification of the semiconductor memory according to the second embodiment.

FIG. 15 illustrates a modification of the semiconductor memory according to the second embodiment. Components in FIG. 15 which are the same as those of the semiconductor memory 10 illustrated in FIG. 3 are marked with the same numerals.

A BIST control circuit 130 included in a semiconductor memory 10a includes an adder 13c in addition to a counter 13a and a register 13b. The adder 13c may be located outside the BIST control circuit 130.

The adder 13c adds a fixed pulse number to SPTCNT [sector] which is the number of erase pulses obtained by a first erase test. For example, a fixed value to be added to SPTCNT [sector] can be set to a value which is greater than or equal to 0 from the outside via a terminal IN. If a fixed value is used, then a value obtained by multiplying (SPTCNT[sector]+ (fixed value)) by (coefficient n) is used as a MAX pulse number (MAXPC) in a second erase test.

For example, if cells in a group pass verification in the first erase test far earlier than cells in another group, then the value of SPTCNT[sector] is too small. As a result, there may appear many cells which fail in verification in the second erase test. Accordingly, the number of replaced cells or the like is referred to. If this number is too large, then the fixed value is added to SPTCNT[sector]. By doing so, the number of erase pulses which is used as a verification threshold in the second erase test can be controlled. The fixed value is set empirically on the basis of, for example, the results of past erase tests.

According to the disclosed semiconductor memory test method and semiconductor memory, relaxation of a verification standard at erase test time based on the influence of a memory cell which needs a long time for erase can be prevented and a decrease in the reliability of a semiconductor memory can be prevented.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor memory test method comprising:
   performing a first erase test by applying an erase pulse to a series of memory cells which are included in a memory cell array and are divided into a plurality of groups and verifying whether erase is completed for a first part of the memory cells in each of the plurality of groups until an appearance of a group for which a determination that the erase of the first part of memory cells has been completed is made; and
   performing a second erase test on other series of memory cells including the series of memory cells based on a number of erase pulses at a time of detecting a group for which the determination that the erase has been completed is made first,
   wherein the first erase test includes:
   verifying by use of a first number of erase pulses whether erase has been completed for the series of memory cells included in a first group and a second group of the plurality of groups;
   storing a row address and a column address of the first memory cell in a register, when it is determined that the erase has not been completed for a first memory cell included in the first group;
   performing a verification on the second group, using the first number of erase pulses by incrementing or decrementing a row address and a column address in the memory cell array;
   reading out the row address and the column address of the first memory cell stored in the register, when it is determined that erase has not been completed for a second memory cell included in the second group; and
   performing the verification on the first group and the second group using a second number of erase pulses based on the row address and the column address read out, the second number being greater than the first number.

2. The semiconductor memory test method according to claim 1, wherein:
   the series of memory cells are a second part of memory cells in a sector of the memory cell array; and
   the other series of memory cells are all the memory cells in the sector.

3. The semiconductor memory test method according to claim 2, wherein the number of erase pulses is determined according to sectors.

4. The semiconductor memory test method according to claim 1, wherein when the first erase test is performed, whether erase has been completed is verified for memory cells in the plurality of groups at a same row address or a same column address by incrementing or decrementing a row address and a column address in the memory cell array.

5. The semiconductor memory test method according to claim 1, wherein the second erase test is performed with a value obtained by multiplying the number of erase pulses by a determined coefficient as an upper limit number of erase pulses.

6. The semiconductor memory test method according to claim 1, wherein the second erase test is performed based on a value obtained by adding a determined value to the number of erase pulses.

7. The semiconductor memory test method according to claim 6, wherein the second erase test is performed with a value obtained by multiplying the value obtained by adding the determined value to the number of erase pulses by a determined coefficient as an upper limit number of erase pulses.

8. A semiconductor memory comprising:
   a memory cell array; and
   a test control circuit configured to control the semiconductor memory so as to perform a first erase test by applying an erase pulse to a series of memory cells which are included in a memory cell array and are divided into a plurality of groups and verify whether erase has been completed for a first part of memory cells in each of the plurality of groups until an appearance of a group for which a determination that the erase of the first part of memory cells has been completed is made and so as to perform a second erase test on other series of memory cells including the series of memory cells based on a number of erase pulses at a time of detecting a group for which the determination that the erase has been completed is made first,
   wherein the first erase test includes:
   verifying by use of a first number of erase pulses whether erase has been completed for the series of memory cells included in a first group and a second group included in the plurality of groups;
   storing, at the time of detecting that erase has not been completed for a first memory cell included in the first group, a row address and a column address of the first memory cell in a register;
   performing a verification on the second group by the use of the first number of erase pulses by incrementing or decrementing a row address and a column address in the memory cell array;
   reading out the row address and the column address of the first memory cell stored in the register, when it is determined that the erase has not been completed for a second memory cell included in the second group; and
   performing the verification on the first group and the second group by the use of a second number of erase pulses based on the row address and the column address read out, the second number being greater than the first number.

* * * * *